(12) United States Patent
Eldridge

(10) Patent No.: US 7,470,140 B1
(45) Date of Patent: Dec. 30, 2008

(54) INTEGRATED CHIP CLAMP ADJUSTMENT ASSEMBLY AND METHOD

(76) Inventor: David Eldridge, 26150 Bucks Run, Salinas, CA (US) 93908

( * ) Notice: Subject to any disclaimer, the term of this patent is extended or adjusted under 35 U.S.C. 154(b) by 0 days.

(21) Appl. No.: 11/764,229

(22) Filed: Jun. 18, 2007

(51) Int. Cl.
*H01R 13/627* (2006.01)

(52) U.S. Cl. ..................................................... 439/357

(58) Field of Classification Search ................ 439/357; 29/842, 739, 566.2
See application file for complete search history.

(56) References Cited

U.S. PATENT DOCUMENTS 3,587,385 A * 6/1971 Orend .......................... 409/232
3,609,838 A * 10/1971 Wiest ........................... 29/38 C
4,209,088 A * 6/1980 Siarto ....................... 198/345.3

* cited by examiner

*Primary Examiner*—Jean F Duverne
(74) *Attorney, Agent, or Firm*—Central Coast Patent Agency, Inc.

(57) ABSTRACT

Disclosed herein is an apparatus that relates to a device useful in integrated chip (IC) testing apparatus. More particularly, the device is an adjustable clamp assembly which allows a variety of different sized IC's to be used with a single piece of test equipment. The clamp assembly includes a frame, a base and a plurality of clamps. Each clamp is movably connected to the base to allow movement in the x-y directions and each of the clamps includes an z-direction adjustment mechanism. Additionally, the device according to this invention also includes an adapter having opposed adapters which are designed for compatible mating with a mechanized handlers. In an exemplary embodiment, the adapter has a suspension system designed for quiet mechanized handling of the IC while being held by the clamp assembly.

8 Claims, 5 Drawing Sheets

INTEGRATED CHIP CLAMP ADJUSTMENT ASSEMBLY AND METHOD

RELATED APPLICATION

First concurrently with this application is an application entitled Suspension System And Adjustment Mechanism For An Integrated Chip And Method having the same inventive entity. The entire specification of the Suspension System And Adjustment Mechanism For An Integrated Chip And Method is specifically incorporated herein.

FIELD OF THE INVENTION

This invention generally relates to electronic equipment used to manipulate an integrated chip (IC) from one location or position to another. More particularly, the electronic equipment subject of this invention is used for securing an IC during manipulation and more particularly to using the same basic structure for a variety of different sized or out of tolerance IC's.

BACKGROUND OF THE INVENTION

In the process of testing and manufacturing integrated chips, the IC itself must be moved from one location to another without damaging or disturbing the delicate electronics on the chip. In order to move the IC from one place to another, the IC is placed on a holding device or clamping assembly and secured thereto and then moved for further manipulation, including manufacture and testing.

Typically, such a device or assembly has a center defining a chip socket where the IC is placed for secure attachment to the device. Typically, the chip socket is fixed and the IC itself must be within certain tolerances to fit properly within the chip socket. If the IC does not fit properly within the chip socket, either the IC, itself, would be rejected and tossed away or the chip socket would need to be altered to fit the IC.

Thus, even IC's that are only out of tolerance a small amount will not fit in the chip socket. However, these same IC's are potentially useful and functional except for the slight out of tolerance size limitations.

Since neither above alternative is desirable, there exists a need to develop another alternative. In this alternative the clamping assembly accepts even out of tolerance IC's without needing extensive modification or remaking of the chip socket. Additionally, a method of using such a device should be quick and efficient and again not require extension remodeling of the chip socket or the IC. Using such a device and method, even different sized IC's and outside normal tolerance IC's can be used, complete manufacturing process and be tested, transported without undue modification of either the IC or the chip socket.

Additionally, it would be desirable for such clamping mechanism to hold the IC securely while in transit, so that moving from one position to another would not damage the IC. And, finally it would be desirable to such device to be handled by a automated means.

In accordance with the long felt need described above, the invention herein is described in detail below.

SUMMARY OF THE INVENTION

It is an object of this invention to provide an adjustable clamp assembly, which allows for flexibility in accommodating different and out of tolerance IC's in the manufacturing and testing process.

It is an additional object of this invention to provide such an assembly, which enables a mechanical handler to be used in transporting the IC from station to station.

It is an additional object of this invention to provide such an assembly, which easily and efficiently accommodates different sized and even different shaped IC's.

In an exemplary embodiment of the adjustable clamp assembly in accordance with this invention, the assembly comprises:

a frame;

a base nested within the frame; and a clamping mechanism having means for securing an integrated chip to the assembly, the clamping mechanism being movably connected to the base, the clamp mechanism including a plurality of clamps which are independently movable with respect to the base to adapt to accommodate different sized integrated chips (IC's) and each clamp adapted to work cooperatively with the other clamps to secure an integrated chip (IC) to the assembly, whereby, the clamp mechanism is adjustable for securing a variety of different sized integrated chips to clamp assembly.

In another exemplary embodiment of the adjustable clamp assembly in accordance with this invention, the assembly includes specific structure for adjustment of the clamping mechanism along the x, y and z axis. The adjustment of the clamping mechanism along each axis is independent of one another.

In a more specific embodiment, the frame includes a strut member which cooperatively interacts with the clamping mechanism adjustment member to allow adjustment of the clamp along the z axis. In another exemplary embodiment, the clamping mechanism includes a first and second pair of wing members which includes adjustment members for allows tightening and loosening of the wing members relative to the base. The base has compatibly sized and shaped slots to cooperatively interact with the adjustment members to afford adjustment of each clamp along the x-y axis.

In an additional embodiment, the adjustable clamp assembly in accordance with this invention includes an adapter for mechanized handler of the assembly. The adapter attaches to the frame and does not interfere or affect in any, the above functioning of the adjustable clamp assembly in accordance with this invention. Additionally, in an exemplary embodiment of the adapter, the adapter includes at the point of contact between it and the mechanized handler a fitting. The fitting is sized and shaped for compatible engagement of the handler. Additionally, the fitting includes a suspension system to ensure that the IC secured to the adjustable clamp assembly in accordance with this invention, is protected from damage as it is transported from station to station.

It is an advantage of this invention to provide an adjustable clamp assembly, which is adjustable and accommodates a variety of different sized and out of tolerance IC's.

It is an additional advantage of the adjustable clamp assembly in accordance with this invention to effectively increase the yield of IC's in the manufacturing and testing process.

BRIEF DESCRIPTION OF THE DRAWING

For a further understanding of the objects and advantages of the present invention, reference should be had to the following detailed description, taken in conjunction with the accompanying drawing, in which like parts are given like reference numerals and wherein.

DETAILED DESCRIPTION OF THE INVENTION

Figure 1:
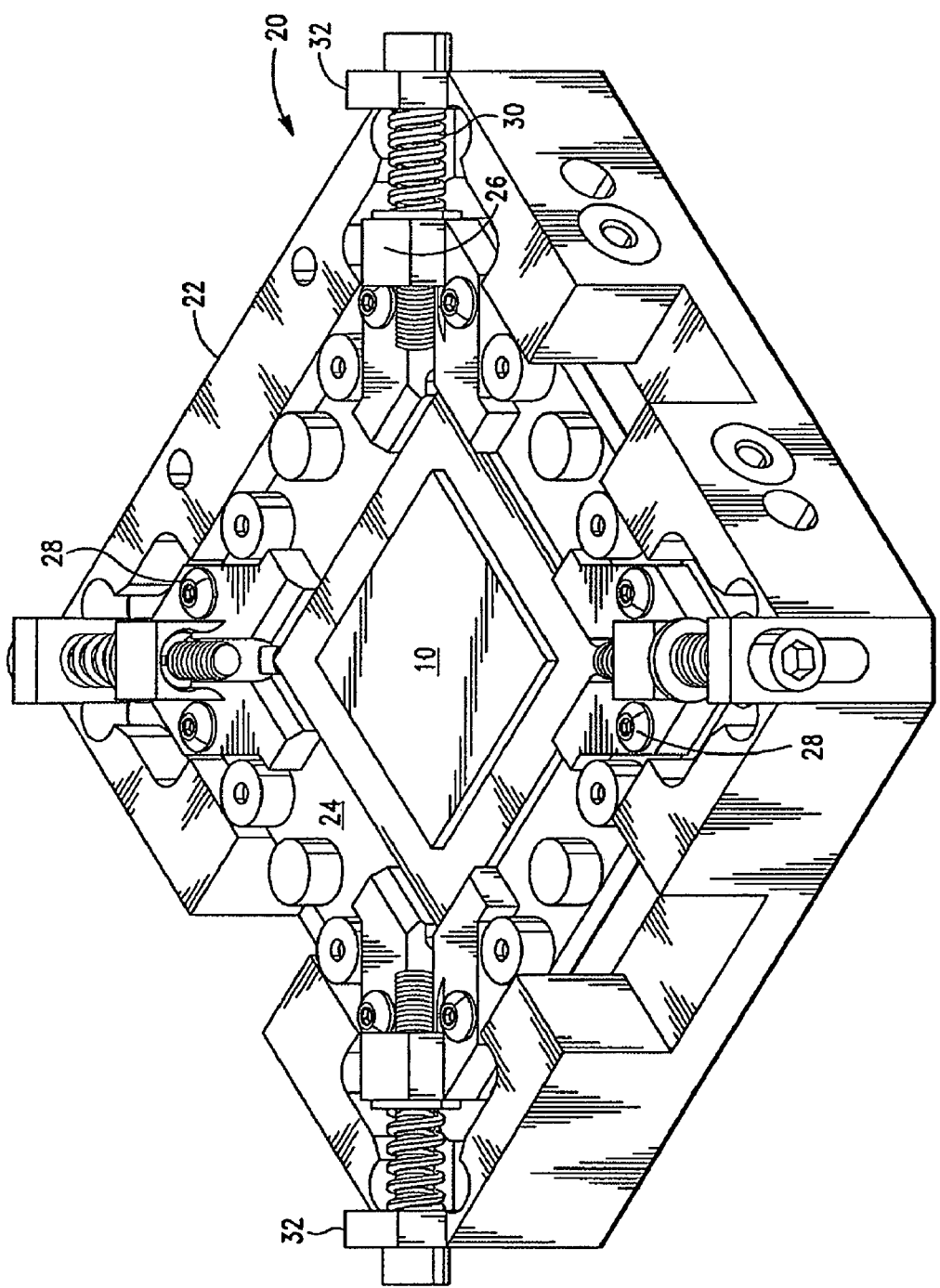
FIG. 1 is a perspective view of the adjustable clamp assembly in accordance with this invention.

An exemplary embodiment of the present invention will now be described with reference to the figures and in particular to FIG. 1, wherein there is shown the invention, an adjustable clamp assembly, generally indicated by the numeral 20. The clamp assembly 20 includes a clamping mechanism 26, a frame 22 and a base 24.

Figure 6:
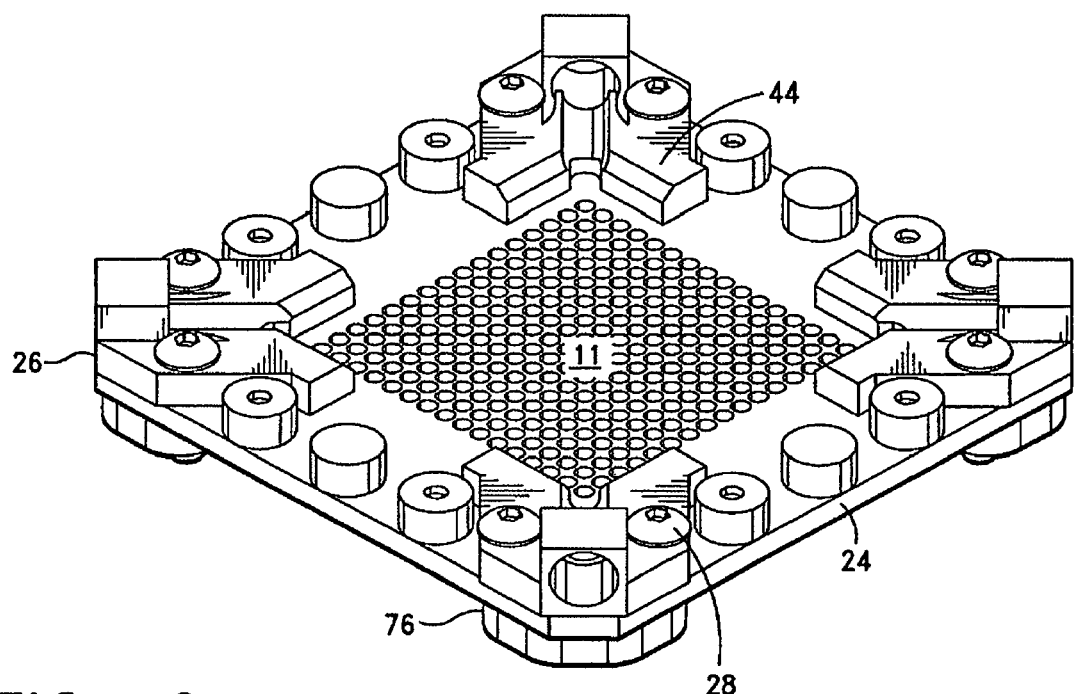
FIG. 6 is a perspective view of the top of the base of the adjustable clamp assembly in accordance with this invention.
Figure 7:
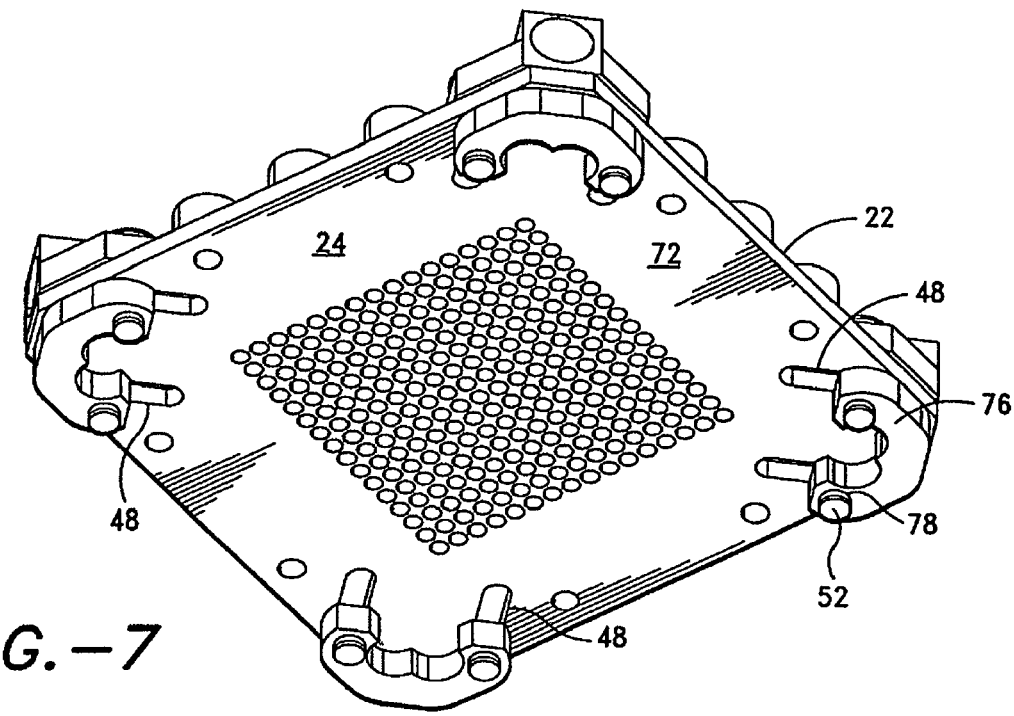
FIG. 7 is a perspective view of the bottom of the base of the adjustable clamp assembly in accordance with this invention.

The base 24 nests within the frame 22 as is particularly clear with respect to FIGS. 1 and 6 and 7. The frame 22 has a central opening or cradle 11. The clamping mechanism 26 is secured to the base 24 via base adjustment members 28. As will be explained more fully hereinafter, these members 28 allow adjustment of the clamping mechanism 26 in the x-y directions as well as securing the clamping mechanism 26 to the base 24. Additionally, the clamping mechanism 26 includes a frame adjustment mechanism 30.

Figure 5:
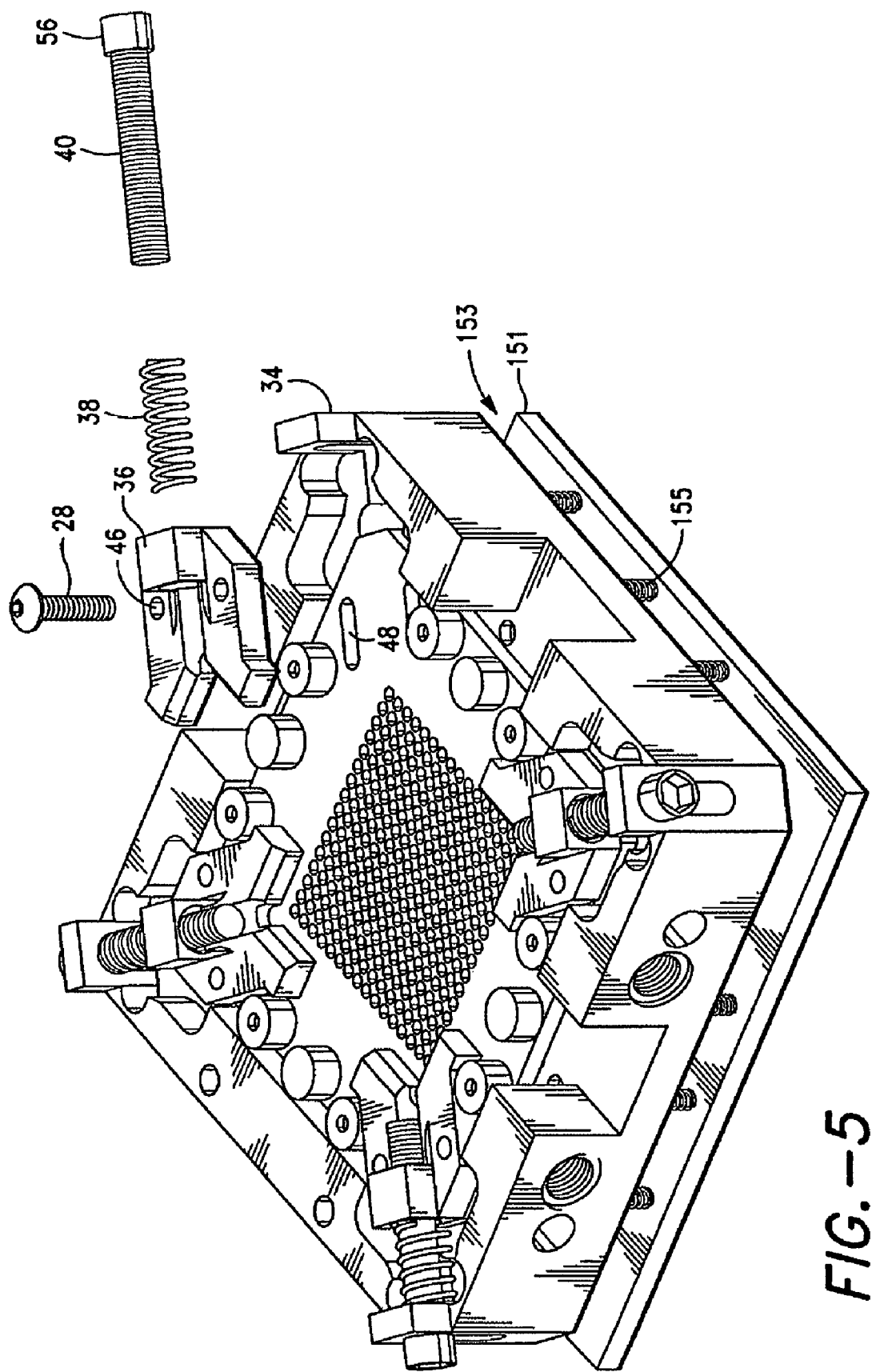
FIG. 5 is a partially exploded view of the clamp and adjustment mechanism of the adjustable clamp assembly in accordance with this invention.

The frame 22 has an upstanding member 32, defining a strut having an opening 34 (FIG. 5). The frame adjustment member 30 interacts with the strut 32 and allows z-axis adjustment of the clamping mechanism 26 as will be explained more fully with respect to FIG. 5.

As illustrated in FIG. 1, the IC 10 is held in place by the clamping mechanism 26. Also, as illustrated in FIG. 1, the combination of the base adjustment members 28 (x-y directions) and the frame adjustment members 30 (z direction) allow a variety of various sized and shaped IC's to be held by the adjustable clamp assembly 20. Additionally, even out of tolerance IC's can be secured and tested using the apparatus of the invention, namely the adjustable clamp assembly 20.

With respect to FIG. 5, there is shown an exploded view of the clamping mechanism 26. The clamping mechanism 26 includes a clamp 36, a spring member 38 and a screw member 40. The clamp 36 has a central block 42 and a pair of wing members 44 on opposed sides of the central block 42. The wing members 44, in combination form a distal end 45, which is sized and shaped for compatible engagement with the IC 10. In the exemplary embodiment shown in the Figs., the distal end forms an orthogonal end zone.

As described above, with respect to FIG. 1, the clamp 36 is secured to the base 24 by the base adjustment members 28. Each of the wing members 44 has an opening 46. Additionally, the base 24 has compatible sized openings 48. The base adjustment members 28 are threaded through the openings 46 and 48. As shown particularly clearly in FIGS. 5 and 7, the base adjustment members 28 after being threaded through the openings 46 and 48 is secured by a locking member 50 which can be tightened or loosened to allow x-y adjustment.

The openings 48 define longitudinal slots, which can be independently adjusted to ensure a proper fit of the clamp 36 and IC. Base adjustment member 28 includes an adjustment screw 50 and a locking member 52. The adjustment screw 50 is threaded through the opening 46 in the wing member and base opening 48 and secured in place by the locking member 52. Thus, each wing member 44 is independently adjustable. In this manner, the distal end zone 45 is adjusted to engage the IC 10. The combination of the distal ends 45 of each of the clamping mechanisms 26 secure the IC 10 to the adjustable clamping mechanism 20.

Thus, using the longitudinal slots, the clamping mechanism 26 is adjusted in the x-y directions until it is secured in place as will be explained more fully hereinafter with respect to FIGS. 2-4. The mechanism for adjustability in the z direction will now be explained with reference to the Figs., and more particularly to FIG. 5.

The screw member 40 is threaded through the strut opening 34 and then through the spring member 38 and into a compatible threaded opening 54 in the central block 36. The spring normally urges the screw member 40 away from the cradle or central opening in the adjustable clamping assembly 20. The screw member 40 has a knurled end 56, which allows for easy adjustment of the clamping mechanism 26 in the z direction. Also, in the exemplary embodiment shown in FIG. 5, screw member 40 has a hex end zone 58 with a central opening 60 to allow adjustment via an alien wrench or similar tool.

In use, the IC 10 is placed in the cradle 11 and secured into place. A test board 151 having a plurality of electrical contacts is placed directly underneath the clamping mechanism 20. As will be more fully appreciated with specific reference to the incorporated inventor's jointly filed and related application, pressure is applied to the IC using the device of the incorporated application or other device which can correctly and appropriately apply such pressure. This type of connection is called the direct connect method.

In an exemplary embodiment of the device and method herein, a suspension system 153 is included between the test board 151 and the clamping member 20. The suspension system 153 includes springs 155 connected through posts 157 which attach to both the test board 151 and the clamping member 20 holding the suspension system 153 in place.

Figure 2:
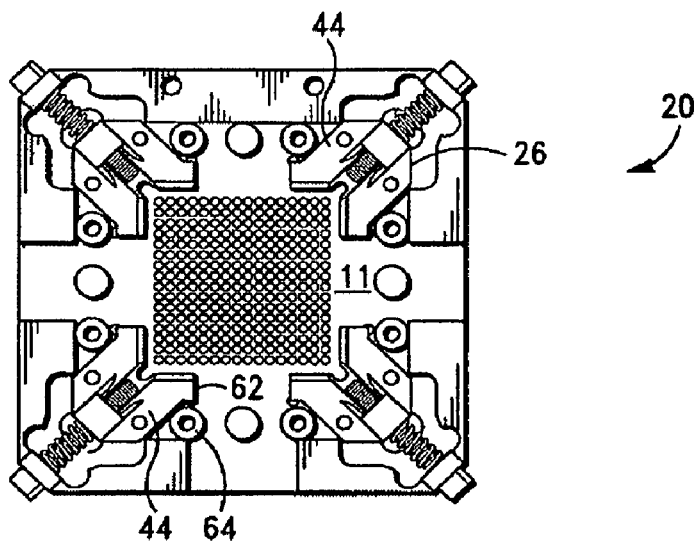
FIGS. 2-4 are top plan views of the movement of an exemplary embodiment of the adjustable clamp assembly in accordance with this invention.
Figure 3:
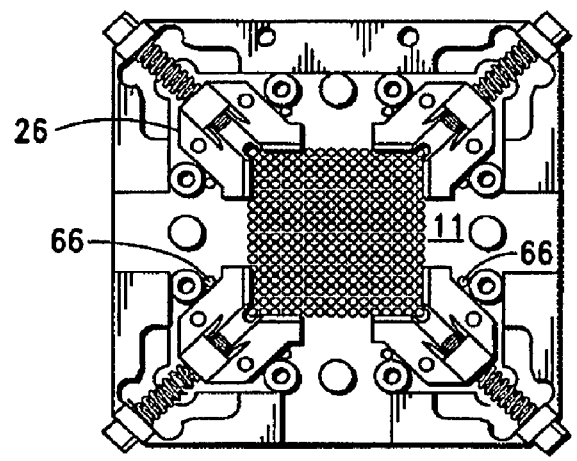
Figure 4:
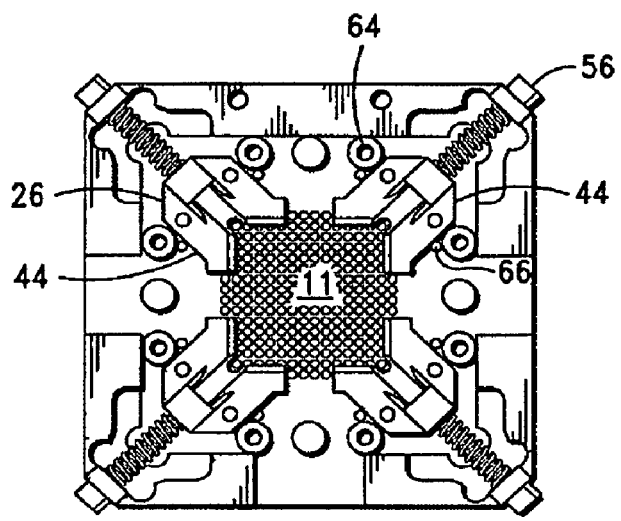

With particular reference to FIGS. 2-4, there is shown the operation of the adjustment clamping assembly 20. In FIG. 2, the clamping mechanism 26 is shown with the wing members 44 completely retracted. The distal end zone 45 has an exterior side having an abutment flange 62. In the completely open position illustrated in FIG. 2, the abutment flange 62 rests against base stop 64 preventing further movement away from the central opening or cradle 11 of the frame 22.

In FIG. 3, the clamping mechanisms 26 extend, at least part way into the cradle 11. The screw members 38 have been turned using either the knurled end 56 or a tool against the hex end zone 58 to cause the wing members 44 to advance toward the center of the cradle 11.

FIG. 4 illustrates the wing members 44 fully advanced into the central opening of the cradle 11. A second stop 66 prevents further advancement of the wing members 44 as illustrated.

As can be readily seen from the above series of Figs., an IC 10 of various dimensions and even non-perfect shapes and sizes can be accommodated within the cradle 11 and made to fit securely. This method and assembly allows for greater flexibility and consequently higher yields when producing and testing ICs.

The base 24 will now be described in detail with reference to the Figs. and specifically to FIGS. 6 and 7. As illustrated, the top portion of the base 24, in combination (FIG. 1) with the frame 22 defines a central opening known as the cradle 11. Positioned around the cradle are four clamping mechanisms 26. Each mechanism 26 is adjusted in the x, y and z directions independently as described above.

In order to accomplish x-y adjustment, the base adjustment screw 50 is loosened and tightened as appropriate. To facilitate the same, the screw 50 has a hex end 70 which is designed for receiving a tool, such as an alien wrench and snugly securing the particular wing member 44 to the base 24. Similarly, the hex end and a tool are used for loosening the screw and re-adjusting for another different sized IC.

As shown particularly in FIG. 7, the base 24 includes a bottom portion 72. As can be clearly seen, the clamping mechanism 26 includes a locking member 74. The locking member 74 has a pair of bottom wings 76 and matches, generally, in size and shape the wing members 44. Additionally, the bottom wings 76 have a bottom opening 78, which matches and is aligned with, the wing member openings 46. As illustrated, the screw member 50 is threaded through wing member opening 46, base opening 48 and bottom wing member opening 78. Also as illustrated, the locking member 52 comprises a nut or similar element and secures the screw member 50 during tightening and loosening.

As can be readily seen from FIGS. 6 and 7, the wing members 44 and 76 sandwich the base 24 between themselves and insure a secure fit for the clamping mechanism against the base 24. At the same time, the secure fit also facilitates the secure fit of the IC 10 to the clamping assembly 20 when the IC 10 is inserted into the cradle 11 and the wing members 44 are properly adjusted and secured to the base with the IC 10.

It will be appreciate that the method of this invention includes being able to independently adjust the X, X and Z axis regardless of order. Since the X-Y adjustment is not dependent on the frame 22, the complete X-Y or Z axis adjust can occur without the slightest concern for the Z axis adjust. Similarly, the Z axis adjustment occurs without the slightest concern for the X-Y axis adjustment.

Figure 8:
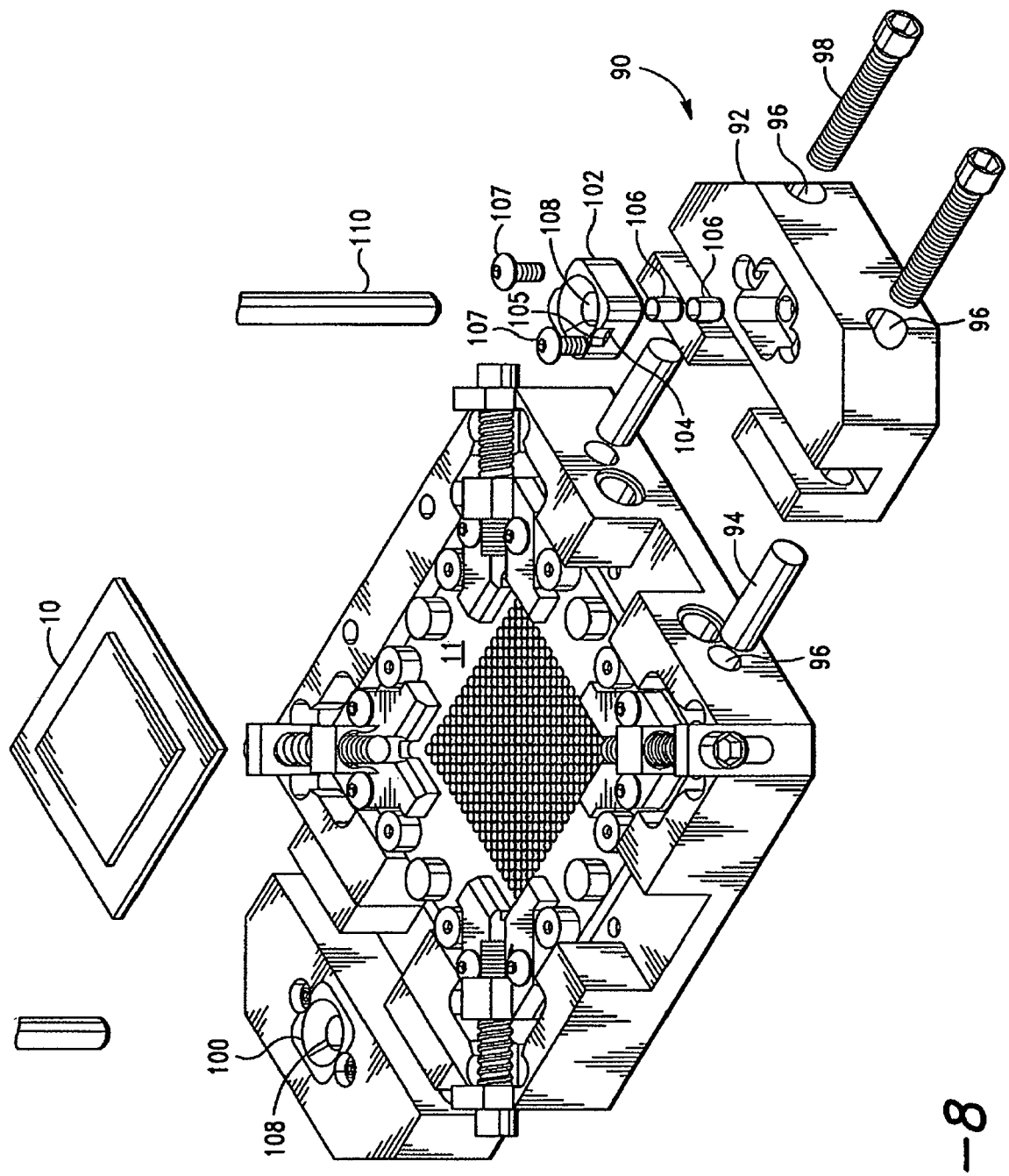
FIG. 8 is a perspective view of one exemplary embodiment of the adjustable clamp assembly in accordance with this invention including a handler assembly for mechanized handling of the clamp assembly.

With particular reference to FIG. 8, the adapter assembly, generally shown by the numeral 90, will be described. The adapter assembly 90 is designed to allow a handler mechanism to quietly, without causing injury or upsetting the secure adjustment of the IC within the cradle, move the entire clamping assembly 20 from one station to another. Clearly, it facilitates some testing to be able to mechanically move the IC 10 from one location to another to perform different tests. Very often these tests can not be performed properly while there is even the possibility of human contamination. Therefore, the adapter assembly 90 is provided to allow quiet transportation of the IC 10 while in the clamping assembly 20.

The assembly 90 includes a pair of adapters 92 on opposed sides of the clamping assembly 20. Each adapter 92 is sized and shaped for compatible mating engagement with the frame 22. A pair of pins 94 fit into compatible sized and shaped openings 96. Adapter screws 98 are threaded through openings 96 and secured thereby to the frame 22.

The assembly 90 further includes in the exemplary embodiment shown in FIG. 8 a member 100 for direct engagement of the adapter assembly 90 with a mechanical device (not shown). The member 100 includes a fitting element 102 which as a pair of tabs 104 and openings in the tabs 104 for securing the member 100 to the assembly 90. Screws 107 are threaded through the tab openings 105 and provide secure engagement of the member 100 to the assembly 90.

The member 100 fitting element 102 rides on a suspension system 103 and features spring-like members 106 between the fitting element and the member 100 and assembly 90. The member 100 has a central opening 108 located and aligned with the suspension system 103. A pin 110 from the mechanical handling device (not shown) compatibly engages the fitting 102 through the central opening 108 and provides a secure fit therewith. Quiet handling of the IC 10 within the cradle 11 is ensured by the suspension system 13. Thus, the fitting of the IC 10 within the adjustable clamping assembly 20 is maintained even during handling.

While the foregoing detailed description has described several embodiments of the adjustable clamp assembly in accordance with this invention, it is to be understood that the above description is illustrative only and not limiting of the disclosed invention. Particularly, there can be a variety of differently structured clamping mechanism which function to hold a variety of different sized or even allow for the adjustment of out of tolerance IC's. It will be appreciated the foregoing are but exemplary embodiments and that there are numerous embodiments that are not mentioned but within the scope and spirit of this invention. Thus, the invention is to be limited only by the claims as set forth below.

What is claimed is:

1. An adjustable assembly for holding an integrated circuit chip during transport and test, comprising:
    a frame comprising four sides and four corners;
    a support surface within the frame for supporting one square or rectangular integrated circuit chip during transport or test; and
    four horizontally adjustable mechanisms, one implemented at each corner of the frame, each mechanism having two vertical surfaces forming a square inside corner such that the four mechanisms form a square or rectangular enclosure for positioning and holding an integrated circuit chip on the support surface;
    wherein each adjustable mechanism is constrained to be adjustable on the frame along a diagonal of the square or rectangle formed by the four mechanisms to accommodate integrated chips having differing lengths and widths.

2. The adjustable assembly as set forth in claim 1, wherein each mechanism comprises a locking device for securely locking the mechanism at a specific position relative to the frame, after the four mechanisms are adjusted to accommodate an integrated circuit chip of a certain size.

3. The adjustable assembly as set forth in claim 2, wherein the frame has a strut at each corner having a threaded opening with an axis directed along the diagonal of the square or rectangle, and adjustment for each mechanism is by a threaded element engaged in the threaded opening.

4. The adjustable assembly as set forth in claim 2, wherein each horizontally-adjustable mechanism further comprises a compression spring urging the mechanism toward an integrated circuit chip on the support surface.

5. The adjustable assembly as set forth in claim 1, wherein the assembly further comprises a handler adapter assembly including two opposed adapters on either side of the clamp assembly.

6. The adjustable assembly as set forth in claim 5, wherein the handler adapter includes means for securing it to the clamp assembly and wherein the handler adapter includes a handler port for connection to the mechanized means.

7. The adjustable assembly as set forth in claim 6, wherein the handler adapter includes a suspension system in the handler port for quiet mechanized handling of the assembly.

8. The adjustable assembly of claim 1 further comprising openings in the support surface in a pattern to accommodate entry from below of test pins for establishing contact with contact surfaces on an integrated circuit chip on the support surface and constrained by the adjustable assembly.

* * * * *